United States Patent [19]
Huang

[11] Patent Number: 5,814,544
[45] Date of Patent: Sep. 29, 1998

[54] FORMING A MOS TRANSISTOR WITH A RECESSED CHANNEL

[75] Inventor: Tiao-Yuan Huang, Cupertino, Calif.

[73] Assignee: VLSI Technology, Inc., San Jose, Calif.

[21] Appl. No.: 687,294

[22] Filed: Jul. 25, 1996

Related U.S. Application Data

[63] Continuation of Ser. No. 489,772, Jun. 13, 1995, abandoned, which is a continuation of Ser. No. 275,207, Jul. 14, 1994, abandoned.

[51] Int. Cl.$^6$ .................................................. H01L 21/265
[52] U.S. Cl. .......................... 438/291; 438/298; 438/301
[58] Field of Search .................. 437/203, 29, 41 RG, 437/44, 45, 979, 27, 40 RG; 438/9.66, 981

[56] References Cited

U.S. PATENT DOCUMENTS

| | | | |
|---|---|---|---|
| 4,685,196 | 8/1987 | Lee .......................................... | 437/203 |
| 4,748,134 | 5/1988 | Holland et al. ........................... | 437/24 |
| 4,764,248 | 8/1988 | Bhattacherjee et al. ................. | 156/643 |
| 4,803,173 | 2/1989 | Still et al. .................................. | 437/29 |
| 4,939,100 | 7/1990 | Jeuch et al. ............................. | 437/203 |
| 4,992,388 | 2/1991 | Pfiester ..................................... | 437/40 |
| 5,075,242 | 12/1991 | Nakahara .................................. | 437/45 |
| 5,108,937 | 4/1992 | Tsai et al. ................................. | 437/40 |
| 5,338,968 | 8/1994 | Hodges et al. .......................... | 257/647 |
| 5,342,796 | 8/1994 | Ahn et al. ................................ | 437/203 |
| 5,448,094 | 9/1995 | Hsu ....................................... | 437/40 RG |
| 5,480,823 | 1/1996 | Hsu ....................................... | 437/2.03 |
| 5,583,064 | 12/1996 | Lee et al. .............................. | 437/41 G |

FOREIGN PATENT DOCUMENTS

| | | | |
|---|---|---|---|
| 321347 | 6/1989 | European Pat. Off. .......... | 437/40 RG |
| 2-98939 | 4/1990 | Japan ................................ | 437/40 RG |
| 5-94998 | 4/1993 | Japan ................................ | 437/40 RG |
| 5-259446 | 10/1993 | Japan ................................ | 437/40 RG |

OTHER PUBLICATIONS

Wolf et al Silicon Processing for the VLSI Era vol. 1: Process Technology, Copyright 1986, pp. 211–213, 220–227.

Primary Examiner—John Niebling
Assistant Examiner—S. Mulpuri
Attorney, Agent, or Firm—Clifton L. Anderson

[57] ABSTRACT

A MOS transistor is fabricated by forming an inverse gate mask consisting of a lower silicon dioxide layer and an upper silicon nitride layer. The exposed channel region is thermally oxidized. The mask is removed to permit a source/drain implant. The oxide growth is removed so that the channel region is recessed. A differential oxide growth then serves to mask the source and the drain for channel threshold adjust and punch-through implants. A doped polysilicon gate is formed, with the thinner area of the differential oxide serving as the gate oxide. In the resulting structure, the punch-through dopant is spaced from the source and the drain, reducing parasitic capacitance and improving transistor switching speeds.

7 Claims, 3 Drawing Sheets

FORMING A MOS TRANSISTOR WITH A RECESSED CHANNEL

This is a continuing application of U.S. patent application Ser. No. 08/489,772, filed Jun. 13, 1995, now abandoned, and which in turn was continuing application of U.S. patent application Ser. No. 08/275,207, filed Jul. 14, 1994, now abandoned.

BACKGROUND OF THE INVENTION

The present invention relates to semiconductor processing and, more particularly, to a method of forming a MOS transistor for an integrated circuit. A major objective of the present invention is to provide for a MOS transistor with enhanced resistance to source-to-drain current punch through.

Much of modern progress is associated with the increasing circuit density and speeds of integrated circuits. A particularly prevalent element of modern integrated circuit is the "MOS" transistor. A MOS transistor comprises a source, a drain, a channel extending between the source and the drain, and a gate, which is located near the channel but insulated from it. The voltage at the gate controls the conductivity of the channel, and thus can control the current between the source and the drain.

In a typical MOS transistor, the source and the drain are heavily doped regions of a monocrystalline substrate. The source and the drain are either both doped p-type, in which case the transistor is referred to as "PMOS", or both doped n-type, in which case the transistor is referred to as "NMOS". MOS transistor channels can be lightly doped as necessary to achieve a desired turn-on voltage for the transistor. Originally, gates were metal conductors and the gate insulators were silicon dioxide. These structures gave rise to the characterization "metal-oxide-silicon", of which "MOS" is an abbreviation. Increasingly, doped polysilicon has replaced metal as the gate conductor material.

Earlier integrated circuits used exclusively NMOS transistors or exclusively PMOS transistors. Most prevalent today is CMOS (Complementary Metal-Oxide-Silicon) technology in which both PMOS and NMOS transistors are fabricated together on integrated circuits. MOS integrated circuits achieve high speeds and circuit densities with relatively low power requirements and, concomitantly, relatively low power dissipation. The low power dissipation minimizes damaging heat buildup, while low power requirements are attractive for portable applications and, more generally, for energy conservation.

In the process of miniaturization, channels have shortened and sources and drains have, of course, come closer together. As the channel length has fallen to 0.5 microns and below, the drain potential can be sufficient to draw current from the source. This "punch-through" current tends to occur through the channel region at a depth near the bottom levels of the sources and drains. The effect of the punch-through current is that some of the desired gate control of the transistor is lost and circuit performance is impaired.

To combat this "punch-through" current, a "punch-through" implant can be performed. This punch-through implant is implanted to a depth comparable to the depth of the source and the drain regions and is of the type opposite the doping of the source and drain regions. The concentration of the punch-through implant is typically much less than that of the source and the drain regions, but comparable to the threshold adjust implant.

A typical method for fabricating a MOS transistor with a punch-through implant is as follows. The voltage adjust and punch-through implants are performed before any other transistor features are defined. Thus, these implants are made not only into the channel region, but also into the source and drain regions. The gate oxide and gate are formed. The source/drain implant is performed, while the channel region is masked by the gate. The source/drain implant reverses the conductivity of the volume it diffuses through.

To reduce a "hot-carrier" effect, the source/drain implant can be performed in two steps. In the hot-carrier effect, errant carriers jump and impair the barrier between the channel and the gate oxide, eventually degrading circuit performance. A light source/drain implant can be performed with the bare gate as a mask. Oxide sidewalls can be grown on the gate. The expanded gate can then be used as the mask for a heavy source/drain implant. This "lightly doped drain" approach reduces the dopant concentrations at the channel/drain and channel/source junctions. The reduced dopant concentrations at the junctions ameliorate the hot carrier effect.

Under normal operation, the drain/substrate junction is reverse biased. Since the drain is more heavily doped than surrounding substrate region, which has the opposite conductivity type, the latter is depleted of carriers near the drain. The depleted substrate region serves as the dielectric of a capacitor constituted by the drain and the opposing undepleted substrate region. The associated parasitic capacitance counters current changes induced by drain voltage changes, thus limiting transistor switching speeds and integrated circuit performance.

The extent of the impairment is correlated with the magnitude of the capacitance. The magnitude of the capacitance is inversely correlated with the width of the depletion region. The width of the depletion region, is for a given source/drain dopant concentration, dependent on the dopant concentration of the surrounding substrate. This concentration is elevated at the level of the punch-through implant. Thus, the punch-through implant becomes a source of performance degradation. What is needed is a method of fabricating a MOS transistor that is resistant to current punch through without suffering a performance penalty due to increased capacitance at the level of a punch-through implant.

SUMMARY OF THE INVENTION

In the inventive method, an inverse-gate mask is defined, preferably using a silicon nitride layer overlaying a thin silicon dioxide layer on a silicon substrate. Oxide is then grown at the exposed gate region. After the mask is removed, the source/drain implant is performed. The oxide growth is removed, leaving a recessed channel region. A differential oxide growth is performed so that a relatively thin oxide grows over the recessed channel region and a relatively thick oxide grows over the source and the drain.

Channel region implants can be performed through this differential oxide growth, which, in effect, serves as a source/drain mask. This source/drain mask confines the bulk of a channel threshold adjust implant and/or a punch-through implant to the channel region. These elevated concentrations in the channel region are thus spaced from heavily doped source/drain regions, reducing parasitic capacitance and improving circuit performance.

The recessed channel itself has a beneficial effect in reducing current punch through. In some cases, an additional punch-through implant may not be required. In this case, parasitic capacitance is minimized. In other cases, a relatively light concentration punch-through implant can prevent punch through. Since the punch-through implant is both relatively light and spaced from the source and drain, its effect on capacitance can still be negligible.

A secondary advantage of the present invention is the automatic formation of lightly doped source and drain regions in the shadow of the oxide formation near the channel region. The shape of the lightly doped regions is a function of the shape of the oxide growth. The shape of the oxide growth can be controlled by selecting the thicknesses of the oxide and nitride layers of the inverse-gate mask. These and other features and advantages of the present invention are apparent from the description below with reference to the following drawings.

Figure 1:
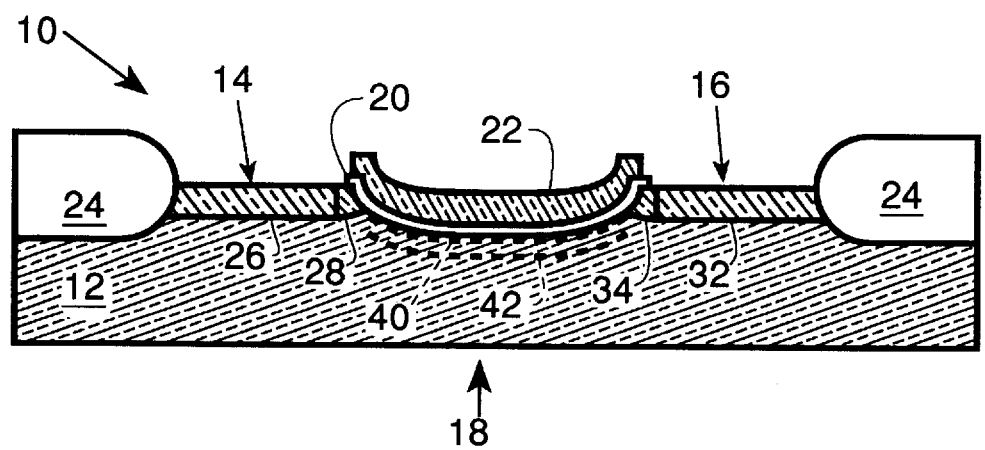
FIG. 1 is a schematic plan view a MOS transistor fabricated in accordance with the method of the present invention.

In the figures, for silicon and polysilicon regions, indicated with alternating solid and broken hatching, dopant type and concentration are very roughly indicated by the sign and slope of the hatching. Unalternating broken hatching indicates undoped silicon nitride.

DESCRIPTION OF THE PREFERRED EMBODIMENTS

Fabricated in accordance with the present invention, an NMOS transistor 10 comprises a lightly doped p-type substrate 12, an n-type source 14, an n-type drain 16, an intermediate channel region 18, a gate oxide 20, and a heavily-doped polysilicon gate 22. Note that channel region 18 is recessed relative to source 14 and drain 16. Transistor 10 is bounded by field oxide 24. Source 14 includes a heavily doped source section 26 and a lightly doped source section 28. Drain 16 includes a heavily doped drain section 32 and a lightly doped drain section 34. Shown in channel region 18 are a shallow p-type threshold adjust implant 40 and a deeper p-type punch-through implant 42.

The method of the present invention begins with p-type substrate 12, upon which field oxide 24 has been grown. Transistor regions are masked during field oxide growth. Upon mask removal, transistor regions are exposed.

Figure 2A:
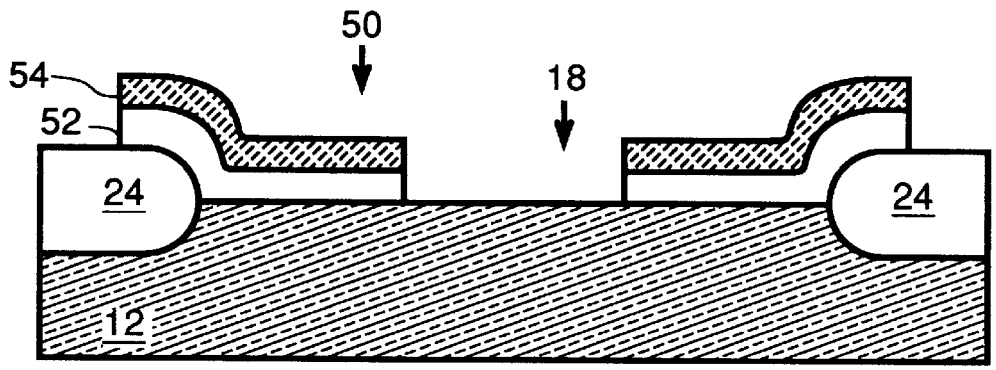
FIGS. 2A–2C are schematic plan views of the MOS transistor of FIG. 1 in successive stages of fabrication through formation of the source and drain regions.

An inverse gate mask 50 shown in FIG. 2A is formed in the first step of the method. A silicon dioxide layer 52 can be grown, or alternatively deposited. The thickness of the oxide can be from 25 Å to 1000 Å, with 500 Å being used in the illustrated embodiment. A silicon nitride 54 layer is deposited over the oxide layer. The thickness of the nitride layer can range from 200 Å to 2000 Å. In the illustrated embodiment, the nitride thickness is 750 Å. The two-layer formation is then photolithographically patterned to expose channel region 18. Preferably, field oxide is also exposed so that it can be built up further during the subsequent thermal oxidation step.

Thermal oxidation of channel region 18 is performed at the second method step. The oxide can be grown to a thickness ranging from 2200 Å to 4400 Å. During thermal oxidation, the thickness of substrate silicon consumed is about 45% of the thickness of silicon dioxide grown. Hence, 1000 Å to 2000 Å of silicon thickness is consumed in this step. In the illustrated embodiment, oxide growth 56 is about 3300 Å so that silicon consumption is about 1500 Å. The results of this growth are indicated in FIG. 2B.

Figure 2B:
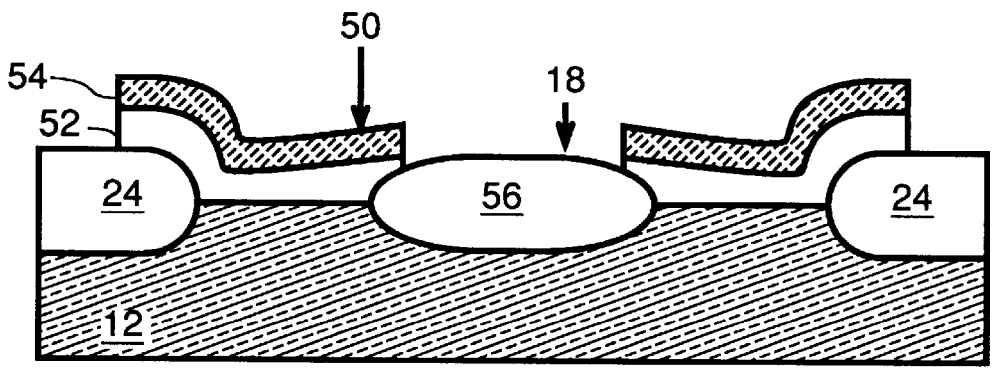

As indicated in FIG. 2B, thermal oxidation is not limited to channel region 18, but extends some distance into the area covered by inverse gate mask 50. Silicon nitride layer 54 is effective at preventing penetration of ambient oxygen. However, ambient oxygen can penetrate oxide mask layer 52 on the exposed sides adjacent channel region 18. Obviously, the thicker oxide layer 52, the more exposed silicon dioxide there is. Accordingly, the lateral extension of oxide growth 56 is a function of the thickness of oxide mask layer 52.

This lateral extension of oxide growth 56 results in a thickening of the oxide beneath silicon nitride layer 54. As a result, silicon nitride layer 54 is lifted near channel region 18. This lifting stresses the silicon nitride, since it is not lifted remote from channel region 18. With this stress is associated a mechanical resistance that correlates with the thickness of nitride layer 54. This resistance inhibits growth of oxide under the nitride layer. Thus, the sharpness of the "beak" of oxide growth 56 can be controlled as a function of the nitride thickness.

In fact, the effects of the oxide and nitride thicknesses on oxide growth lateral extension and shape are interrelated. The ratio of the two thicknesses must be considered in addition to the independent effects of the thicknesses in determining the ultimate extent and shape of oxide growth 56.

Figure 2C:
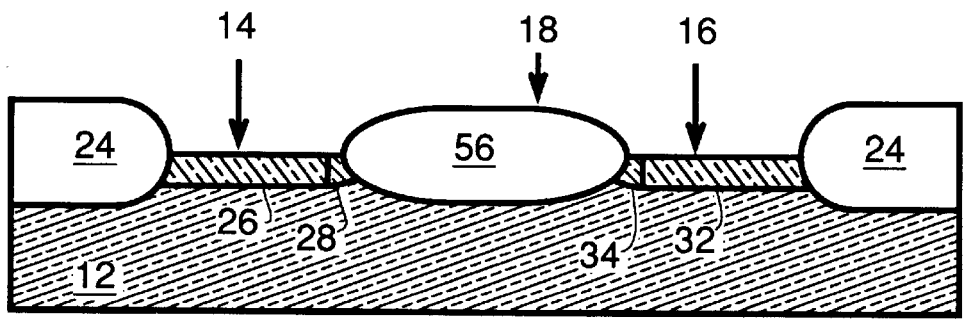

Inverse-gate mask 50 is removed at the third step. A source/drain implant is performed at the fourth step, forming source 14 and drain 16 as shown in FIG. 2C. The "shadow" oxide growth 56 causes the source and drain dopant concentration to decrease gradually toward growth 56. Thus, source section 26 and drain section 32 are heavily doped, e.g., approximately $10^{19}$ to $10^{20}$ atoms per cubic centimeter ($cm^3$). However, lateral sections 28 and 34 are more lightly doped, e.g., $10^{17}$ to $10^{18}$ atoms/$cm^3$.

Lightly doped source section 28 and lightly doped drain section 34 play important roles in reducing the hot carrier effect. The extent and shape of these sections is dependent on the shape of oxide growth 56, which can be controlled as indicated above. Thus, the present invention provides for considerable control over the formation of lightly doped drain and source sections.

Figure 3A:
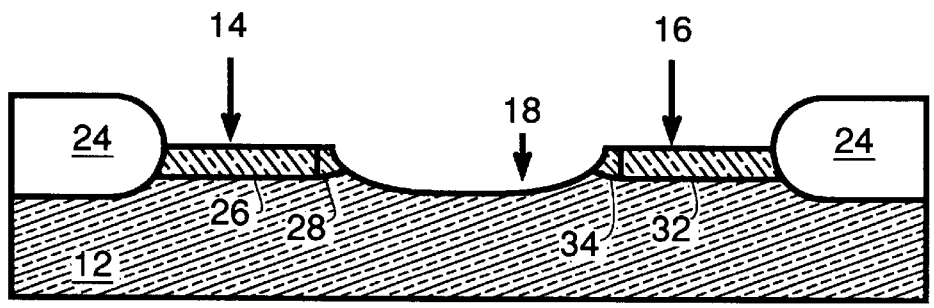
FIGS. 3A–3C are schematic plan views of the MOS transistor of FIG. 1 in successive stages of fabrication after source/drain formation up to the channel implants.

The oxide growth is removed at the fifth step, leaving recessed channel region 18, as shown in FIG. 3A. Since a thick field oxide is desired, it is preferable to mask the field oxide with photoresist during this step. Since the recessed channel can mitigate the threat of punch-through current and since, in some cases, the background channel concentration can be appropriate for the desired threshold voltage, it is possible that no channel implant is required. In that case, a gate oxide can be grown and a polysilicon gate formed at this stage in the method. However, in general a threshold adjust implant and/or a punch-through implant is required. Channel implants are implemented as follows.

Figure 3B:
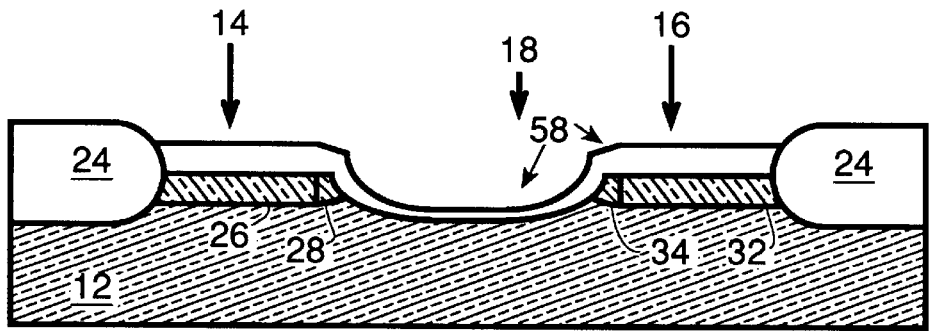

A differential oxide growth is performed at the sixth step. Under conditions of a low oxidation temperature and a wet ambient, oxide grows much more quickly over heavily doped silicon than over lightly doped silicon. Accordingly, differential oxide formation 58 is grown as shown in FIG. 3B. The, differential can be roughly 5:1. Accordingly, the oxide over channel region 18 can be 100 Å–150 Å, while the oxide over source 14 and drain 16 can be 500 Å to 1000 Å.

Figure 3C:
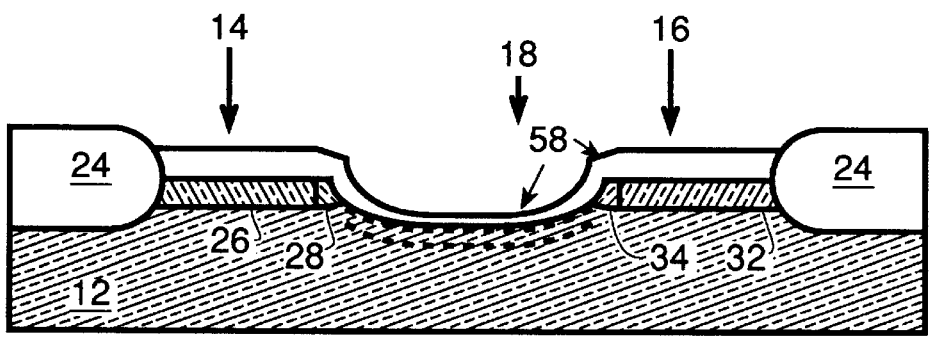

Accordingly, the channel implants can be performed at the seventh step. Light p-type threshold adjust implant 40, with a concentration of about $10^{17}$ cm$^3$ can be performed to a depth range of 100 Å to 1000 Å; this depth is 200 Å in the illustrated embodiment. Punch-through implant 42 can have a concentration of about $10^{17}$ cm$^3$ and have a depth ranging from 500 Å to 1000 Å; this depth is 750 Å in the illustrated embodiment. The resulting structure is shown in FIG. 3C.

Gate 22 can be formed at step eight by depositing polysilicon, patterning the polysilicon, and heavily doping the polysilicon n-type. This leaves the structure of FIG. 1. Alternatively, the differential oxide can be removed and a gate oxide grown prior to step 8. However, it is simpler to allow the differential oxide to serve as the gate oxide.

While the method has been illustrated in the fabrication of an NMOS transistor, it is equally applicable to PMOS transistors and to CMOS technology. For a PMOS transistor, dopant conductivity types can be reversed for the source, drain, and punch-through dopant. The conductivity type of the gate is preferably consistent with that of the source and drain, but need not be if precautions are taken to protect the source and drain from possible counterdoping. The conductivity type of the threshold adjust implant is determined by the direction in which the channel region must be changed to achieve the desired threshold voltage.

The present invention provides for transistors in which either one or both of a threshold adjust implant and a punch-through implant is performed. Furthermore, in a CMOS case, the NMOS and PMOS transistors can be treated differently. For example, a threshold adjust implant can be applied to the PMOS transistors but not the NMOS transistors. The invention provides for different sizes, shapes and depths of the channel-forming oxide growth. The invention also provides for different feature sizes, dopant concentrations. These and other modifications to and variations upon the preferred embodiments are provided for by the present invention, the scope of which is limited only by the following claims.

What is claimed is:

1. A method of forming a MOS transistor having a substrate including a channel region, a relatively lightly doped source, a relatively heavily doped source spaced from said channel region by said relatively lightly doped source, a relatively lightly doped drain, and a relatively heavily doped drain spaced from said channel region by said relatively lightly doped drain, said method comprising the steps of:

forming a mask oxide layer on a silicon substrate;

depositing a mask nitride layer on said mask oxide layer;

etching said mask oxide layer and said mask nitride layer so as to expose said channel region of said substrate;

growing a shadow oxide at said channel region;

removing said nitride layer and said oxide layer so as to leave said shadow oxide over said channel region;

implanting source/drain dopant into source/drain regions of said substrate with said shadow oxide masking said channel region so as to define said relatively lightly doped source and said relatively lightly doped drain adjacent said channel region and said relatively heavily doped source and said relatively doped drain respectively spaced from said channel region by said relatively lightly doped source and said relatively lightly doped drain;

removing said shadow oxide so as to define a channel recess;

growing in a wet ambient a differential oxide more quickly on said source/drain regions than on said channel region so that it is thicker over said source/drain regions than over said channel region;

implanting channel dopant through said differential oxide into said channel region while said differential oxide masks said source/drain regions; and forming a polysilicon gate over said channel region.

2. A method as recited in claim 1 wherein said channel dopant sets the transistor threshold voltage to a predetermined level.

3. A method as recited in claim 1 wherein said channel dopant inhibits current punch through from source to drain.

4. A method as recited in claim 1 wherein said channel dopant is implanted at two distinct levels within said channel region to adjust the transistor threshold voltage and to limit current punch through from source to drain.

5. A method as recited in claim 1 wherein said differential oxide serves to insulate said gate from said channel region.

6. A method as recited in claim 1 further comprising the steps of, after implanting channel dopant and before forming said polysilicon gate:

removing said differential oxide; and growing a gate oxide over said channel region.

7. A method as recited in claim 1 wherein said differential oxide has a minimum thickness of at most 150 Å over said channel region and a maximum thickness of at least 500 Å over said source and drain regions.

\* \* \* \* \*